United States Patent
Busking et al.

[11] Patent Number: 6,107,684
[45] Date of Patent: Aug. 22, 2000

[54] SEMICONDUCTOR DEVICE HAVING A SIGNAL PIN WITH MULTIPLE CONNECTIONS

[75] Inventors: Erik Bert Busking, The Hague; Yang Ling Sun, Delft; Maarten Visee, Houten, all of Netherlands

[73] Assignee: Lucent Technologies Inc., Murray Hill, N.J.

[21] Appl. No.: 09/226,730

[22] Filed: Jan. 7, 1999

[30] Foreign Application Priority Data

Jan. 13, 1998 [EP] European Pat. Off. .............. 98300204

[51] Int. Cl.[7] ......................... H01L 23/495; H01L 23/48; H01L 23/52; H05K 3/46
[52] U.S. Cl. .......................... 257/725; 257/665; 257/666; 257/532; 257/724; 257/691; 257/924; 257/728; 257/784
[58] Field of Search ..................................... 257/736, 697, 257/666, 676, 728, 724, 725, 782, 712, 691, 690, 692, 693, 698, 713, 528, 532, 535, 665, 924

[56] References Cited

U.S. PATENT DOCUMENTS

| | | | |
|---|---|---|---|
| 3,881,137 | 4/1975 | Thanawala | 361/113 |
| 4,393,392 | 7/1983 | Hale | 257/392 |
| 4,714,952 | 12/1987 | Takekawa et al. | 361/402 |
| 4,717,884 | 1/1988 | Mitzlaff | 330/251 |
| 5,065,301 | 11/1991 | Shioya et al. | 363/17 |
| 5,105,172 | 4/1992 | Khatibzadeh et al. | 333/175 |
| 5,164,683 | 11/1992 | Shields | 330/307 |
| 5,173,671 | 12/1992 | Wendler et al. | 333/185 |
| 5,204,614 | 4/1993 | Szente et al. | 324/95 |
| 5,233,310 | 8/1993 | Inoue | 330/277 |
| 5,254,953 | 10/1993 | Crook et al. | 324/538 |
| 5,371,405 | 12/1994 | Kagawa | 257/664 |
| 5,382,882 | 1/1995 | Nerone | 315/307 |
| 5,386,141 | 1/1995 | Liang et al. | 257/676 |
| 5,399,804 | 3/1995 | Yoneda et al. | 174/52.4 |
| 5,428,266 | 6/1995 | Nilssen | 315/209 R |
| 5,473,514 | 12/1995 | Nagano | 361/813 |
| 5,497,032 | 3/1996 | Tsuji et al. | 257/710 |
| 5,546,806 | 8/1996 | Kain | 73/514.31 |
| 5,552,966 | 9/1996 | Nagano | 361/813 |
| 5,569,955 | 10/1996 | Chillara et al. | 257/666 |
| 5,629,559 | 5/1997 | Miyahara | 257/666 |
| 5,646,830 | 7/1997 | Nagano | 361/813 |
| 5,717,249 | 2/1998 | Yoshikawa et al. | 257/728 |
| 5,723,906 | 3/1998 | Rush | 257/723 |
| 5,757,070 | 5/1998 | Fritz | 257/675 |
| 5,767,567 | 6/1998 | Hu et al. | 257/666 |
| 5,789,816 | 8/1998 | Wu | 257/723 |
| 5,844,301 | 12/1998 | Van Roosmalen | 257/532 |
| 5,895,966 | 4/1999 | Penchuk | 257/690 |
| 5,898,225 | 4/1999 | Chio | 257/676 |
| 5,917,233 | 6/1999 | Fryklund et al. | 257/724 |
| 6,002,165 | 12/1999 | Kinsman | 257/666 |
| 6,031,279 | 2/2000 | Lenz | 257/728 |

FOREIGN PATENT DOCUMENTS

| | | | |
|---|---|---|---|
| 86301528 | 3/1986 | European Pat. Off. | H01L 25/16 |
| 195 49 011 | 7/1997 | Germany | H01L 25/07 |

OTHER PUBLICATIONS

European Search Report dated Jun. 8, 1998.

*Primary Examiner*—Alexander O. Williams

[57] ABSTRACT

A semiconductor device comprises a signal pin mounted on a base plate by adhesive. Parasitic capacitance exists between the pin and the base plate in the region of adhesive and may deleteriously affect the operation of circuitry in chip connected to pin by a bond wire. A bond wire connecting pin to the base plate has an inductance which forms a parallel resonant circuit with the parasitic capacitance, so that, at the resonant frequency, signals on pin at substantially the same frequency pass to or from the chip substantially unattenuated by the parasitic capacitance. Alternatively, the inductances of the signal pin and the bond wires may be such that, at the frequency of signals on the signal pin, an impedance transformation is provided between the input to the signal pin and the end of the first bond wire where it connects to the chip.

16 Claims, 3 Drawing Sheets

6,107,684

SEMICONDUCTOR DEVICE HAVING A SIGNAL PIN WITH MULTIPLE CONNECTIONS

CROSS-REFERENCE TO RELATED APPLICATION

This application claims priority of European Patent Application No. 98300204.9, which was filed on Jan. 13, 1998.

TECHNICAL FIELD

This invention relates to semiconductor devices.

BACKGROUND OF THE INVENTION

Microwave-frequency (SHF) circuits of a variety of applications embodied in a semiconductor chip mounted on a base plate and usually contained within a housing are provided with relatively large pins for making connection to a printed-circuit board (PCB) or other substrate. The parasitic capacitance between one or more pins and the baseplate may, however, be unacceptably large, and may seriously degrade circuit performance.

Previous attempts to ameliorate this problem have involved tuning-out the parasitic capacitance with a microstrip line stub to ground, or by an on-chip inductor. Both of these techniques have their disadvantages as will be described later.

It is common practice in the art to ground the chip's ground connection to the base plate and to a ground pin using any suitable arrangement of bonding wires, and to connect the base plate to the ground of the PCB or other substrate.

SUMMARY OF THE INVENTION

The present invention is directed to a semiconductor device comprising a base plate, a semiconductor chip mounted on the base plate, a signal pin mounted on the base plate, there being parasitic capacitance between the signal pin and the base plate, a first bond wire connecting the signal pin to the chip, and at least one second bond wire connecting the signal pin to the base plate.

The inductance of the second bond wire or wires may form, with the parasitic capacitance, at least part of a parallel resonant circuit, wherein signals on the signal pin at a frequency substantially equal to the resonant frequency of the resonant circuit are substantially unattenuated by the parasitic capacitance. Preferably, the inductance of the second bond wire or wires forms, with the parasitic capacitance, the parallel resonant circuit.

The device may include one or more further signal pins, the or each further signal pin being mounted on the base plate, there being respective parasitic capacitance between the or each further signal pin and the base plate, and, for the or each further signal pin: (i) a respective first bond wire connecting that further signal pin to the chip, and (ii) one or more respective second bond wires connecting that further signal pin to the base plate, the inductance of the second bond wire or wires forming, with the parasitic capacitance associated with that further signal pin, a parallel resonant circuit, wherein signals on that further signal pin at a frequency substantially equal to the resonant frequency of the resonant circuit are substantially unattenuated by the parasitic capacitance.

The inductances of the signal pin, the first bond wire, and the second bond wire or wires may be such that, at the frequency of signals on the signal pin, an impedance transformation is provided between the input to the signal pin and the end of the first bond wire where it connects to the chip.

There may be provided a first capacitor connected in shunt with the signal pin, and a second capacitor connected in shunt with the end of the first bond wire where it connects to the chip, the values of the first and second capacitors and the inductance of the second bond wire or wires being such as to provide impedance matching at the signal pin and at the end of the first bond wire where it connects to the chip.

There may be provided a capacitor connected in shunt with the signal pin so as to provide impedance transformation, from a high impedance at the signal pin to a low impedance at the end of the first bond wire where it connects to the chip, at the resonant frequency of the parallel resonant circuit.

Alternatively, there may be provided a capacitor connected in shunt with the end of the first bond wire where it connects to the chip so as to provide impedance transformation, from a low impedance at the signal pin to a high impedance at the end of the first bond wire where it connects to the chip, at the resonant frequency of the parallel resonant circuit.

The device may include a housing enclosing the chip with the base plate.

BRIEF DESCRIPTION OF THE DRAWINGS

The invention will now be described by way of example with reference to the accompanying drawings, in which.

The figures, in which like references denote like parts, are not to any particular or the same scale.

DETAILED DESCRIPTION

Figure 1:
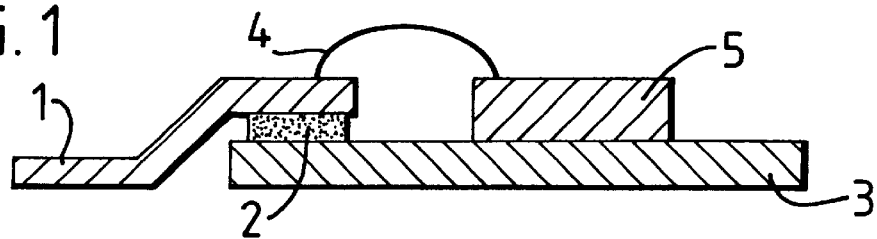
FIG. 1 is a schematic section view of a semiconductor device.

Referring now to FIG. 1, a signal pin 1, for connection to a PCB or other substrate (not shown), is mounted by adhesive 2 on a base plate 3 carrying a semiconductor chip 5 containing electronic SHF circuitry (not shown). The chip 5 is connected to pin 1 by a bond wire 4. Parasitic capacitance between pin 1 and base plate 3 in the region of adhesive 3 may deleteriously affect the performance of the circuitry in chip 5.

Figure 2:
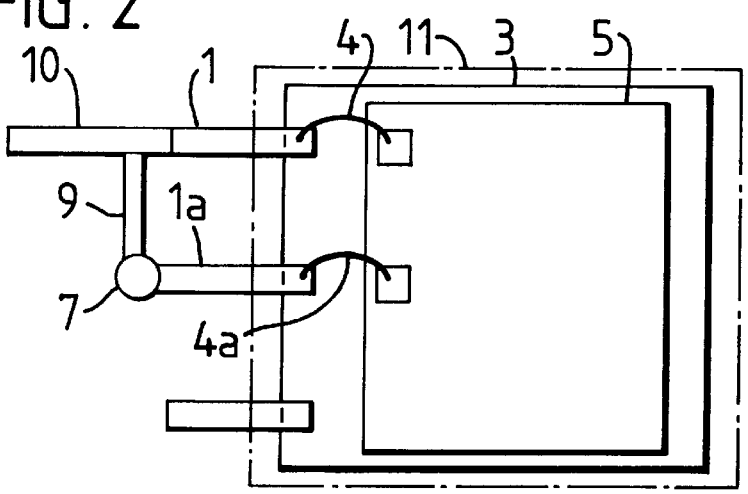
FIG. 2 is a schematic plan view of a semiconductor device showing a known technique for compensating for parasitic capacitance.

One way of compensating for parasitic capacitance will now be described with reference to FIG. 2 which shows a signal pin 1 connected by a bond wire 4 to a chip 5 mounted on a base plate 3. A ground-pin 1a for connection to the ground of a PCB or other substrate (not shown) is connected at one end by a ground bond wire 4a to the ground connection of chip 5, and at the other end to a ground via 7 on the PCB or other substrate. A microstrip line stub 9 connects via 7 to a microstrip line 10 transporting a signal to or from chip 5 and tunes out the parasitic capacitance. A housing or package shown in outline at 11 encloses the chip 5 with the base plate 3.

The disadvantages of this technique are that inaccuracies in the placement of the device on the PCB or substrate, and variations in the soldering process, may give rise to variations in the tuning frequency and hence the parasitic capacitance may not be satisfactorily tuned out. Furthermore, the loop including the microstrip line stub 9 may be so large that crosstalk to other areas of the PCB is likely, and the tuning frequency may be too low to be useful in certain applications.

Figure 3A:
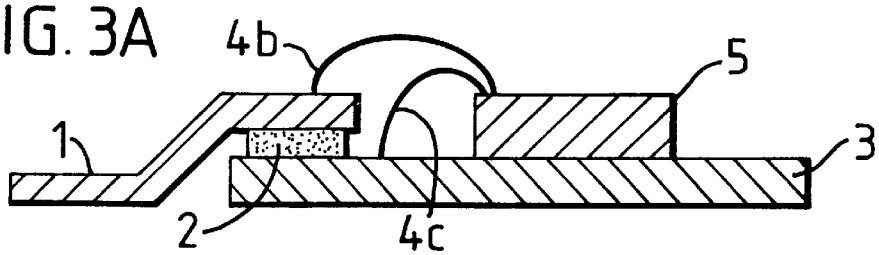
FIGS. 3A and 3B are schematic section and plan views, respectively, of a semiconductor device showing another known technique for compensating for parasitic capacitance.
Figure 3B:
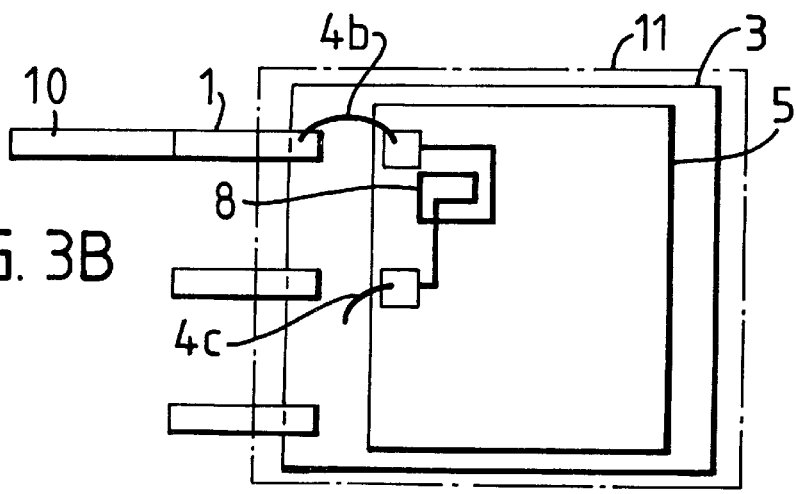

Another way of compensating for parasitic capacitance will now be described with reference to FIGS. 3A and 3B. A signal pin 1, for connection for a PCB or other substrate (not shown), is mounted by adhesive 2 on a base plate 3 carrying semiconductor chip 5 containing electronic SHF circuitry (not shown). The chip 5 is connected to pin 1 by a bond wire 4b. The parasitic capacitance between pin 1 and base plate 3 in the region of adhesive 2 is compensated for by tuning it out with an on-chip inductor 8. A ground bond wire 4c connects the chip 5 to base plate 3. A microstrip line 10 transports signals to or from the chip 5. A housing or package 11 encloses the chip 5 with the base plate 3.

This technique of compensating for the parasitic capacitance has the disadvantages that more chip area is required, more power is lost due to the resistivity of the material of inductor 8, inaccuracies are introduced because the "loop" closed by inductor 8 includes two bond wires, and, for exceptionally high parasitic capacitance, the loop inductance may not be small enough to tune out the parasitic capacitance.

Figure 4A:
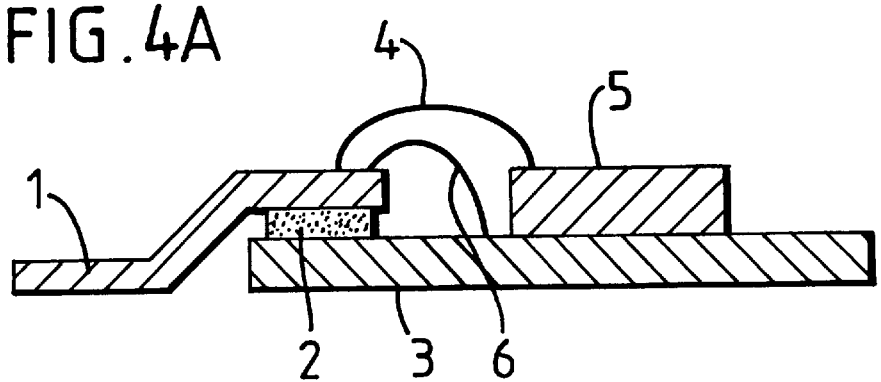
FIGS. 4A and 4B are schematic section and plan views, respectively, of a semiconductor device embodying the invention.
Figure 4B:
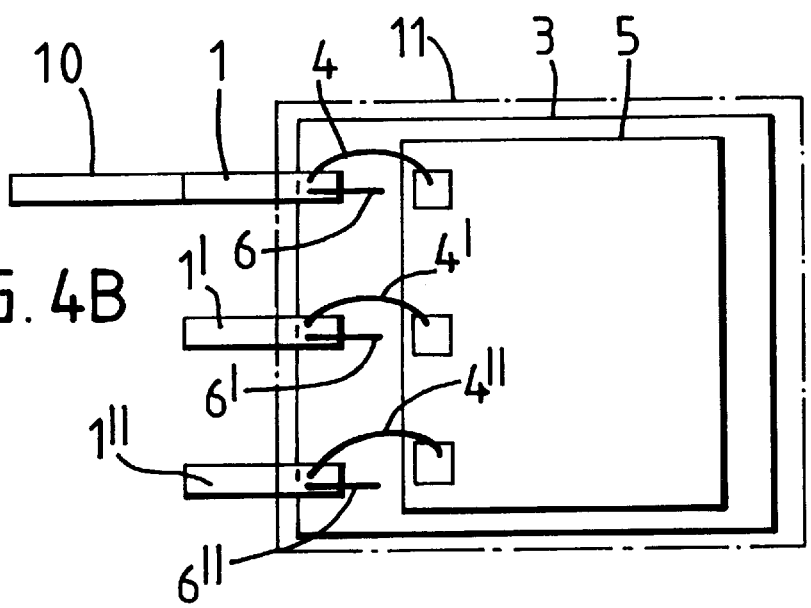

Referring now to FIGS. 4A and 4B, a signal pin 1 is mounted by adhesive 2 on a base plate 3 carrying a semiconductor chip 5 including SHF circuitry (not shown). A first bond wire 4 connects pin 1 to chip 5. A microstrip line 10 transports signals to or from chip 5. As so far described the device of FIG. 4A is similar to that of FIG. 1. In addition, however, the device of FIGS. 4A and 4B includes a second bond wire 6 connecting signal pin 1 to base plate 3. Bond wire 6 forms an inductor whose value can be varied by, for example, connecting it to the base plate 3 at a point closer to or further from the pin 1. This inductor forms, with the parasitic capacitance, a parallel resonant circuit as will be described with reference to FIG. 5. The device includes a housing 11 which encloses the chip 5 with the base plate 3.

Figure 5:
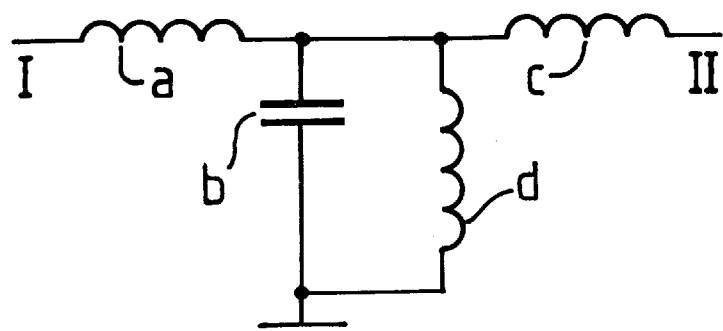
FIG. 5 is a schematic circuit diagram for explaining the operation of the device of FIGS. 4A and 4B.

Referring now to FIG. 5, inductance a represents signal pin 1 in FIGS. 4A and 4B, capacitor b represents the parasitic capacitance between the pin 1 and the base plate 3 in the region of the adhesive 2, inductance c represents bond wire 4, and inductance d represents bond wire 6. Capacitor b and inductance d form a parallel resonant circuit. Such a circuit has a high impedance at its resonant frequency and thus a signal at substantially this frequency can pass between pin 1 and chip 5 substantially unattenuated compared with the attenuation that would be suffered in the device of FIG. 1.

By placing two bond wires 6 in parallel, the inductance may be lowered to accommodate higher signal frequencies and/or larger parasitic capacitances. The length of the or each bond wire may be varied to alter the inductance.

Although the invention has been described with reference to ameliorating the effects of the parasitic capacitance associated with one signal pin, it will be apparent to those skilled in the art that the invention is also applicable to devices where it is desired to compensate for parasitic capacitance associated with more than one pin (1' and 1" in FIG. 4B) by connecting each such pin to the base plate with a respective bond wire or wires 6' and 6". The inductance of the bond wire(s) would be chosen to provide, with its respective parasitic capacitance, a parallel resonant circuit resonant at a frequency substantially equal to the frequency of the signal carried by the respective pin. As previously noted, the inductance of a bond wire may be altered by varying its length and/or point where it connects to the base plate.

Inductance d may be merely part of an inductance in parallel with, and for tuning out, capacitance c, the other part including inductance c with which it forms an inductive voltage divider.

Although the invention has so far been described in its application to tuning out parasitic capacitance, it may also be used as an impedance matching circuit, various examples of which will now be described.

Referring again to FIG. 5, by making inductance d larger, so that the resulting resonant frequency is lower than the signal frequency, the parallel circuit formed by capacitance b and inductance d appears slightly capacitive, i.e. a lower capacitance value than the parasitic capacitance b, and forms with inductance a an impedance transformer, or L-network, the effect of which is to transform a low impedance at Port I (the PCB or substrate) to a higher impedance at the junction of inductances a and c. Assuming inductance c is significantly smaller than inductance a, approximately the same higher impedance appears at Port II.

Even if inductance is not small, the circuit can be used as an impedance matching transformer. Furthermore, if the input and output impedances are not real, a conjugate match may be achieved.

Referring now to FIG. B, by connecting capacitors in parallel to Ports I and II, the resulting network comprises two LC "low pass" L-network sections which are connected in the middle. Impedance matching at both Ports can be achieved by optimisation of the values of the capacitors at Ports I and II and inductance d.

Figure 6:
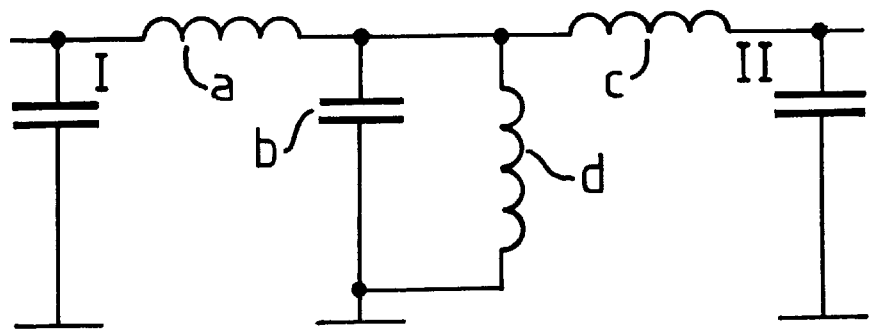
FIGS. 6 to 9 are schematic circuit diagrams for explaining the operation of further embodiments of the invention.
Figure 7:
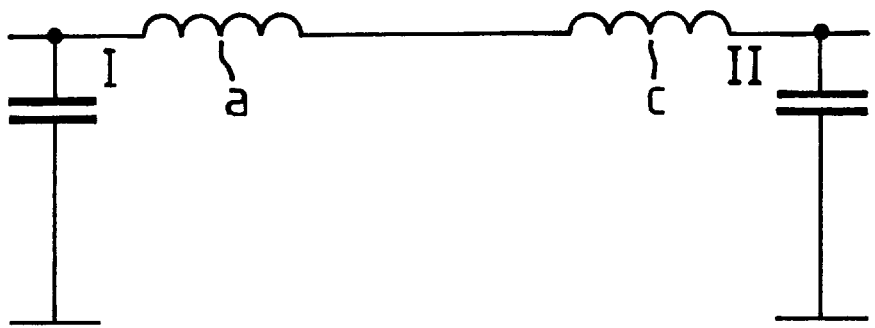

When capacitance b and inductance d are tuned out, i.e., they form a resonant circuit at the frequency of operation, inductances a and c are essentially in series, as shown in FIG. 7. Capacitance b and inductance d are not shown because they are tuned out. Inductances a and c form an inductance whose value is equal to the sum of a and c. It will be appreciated that FIG. 7 is a special case of FIG. 6.

Figure 8:
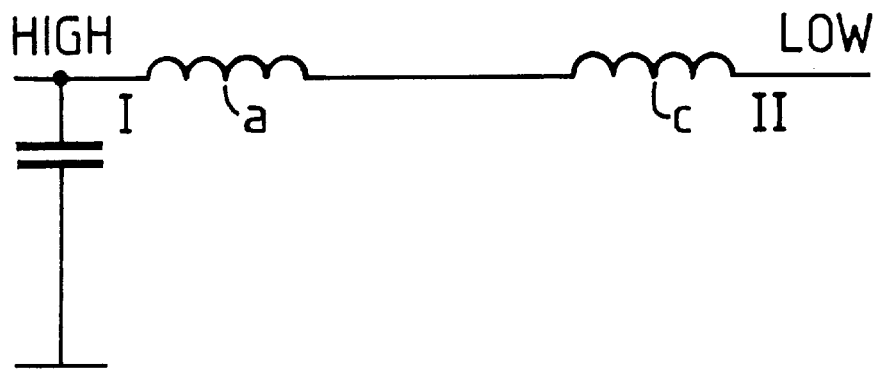
Figure 9:
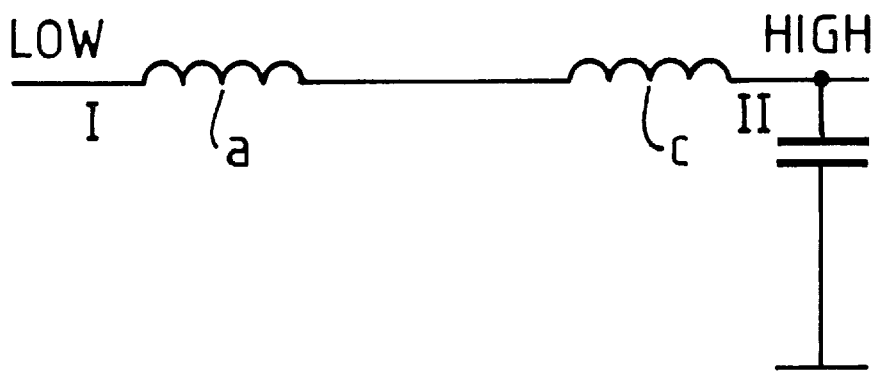

By omitting one or other of the capacitors in FIG. 7, low to high, or high to low impedance matching may be achieved. Thus, with reference to FIG. 8, with a capacitor at Port I only, the circuit transforms from a high impedance at Port I to a low impedance at Port II. With a capacitor at Port II only, as shown in FIG. 9, the circuit transforms from a low impedance at Port I to a high impedance at Port II.

A circuit embodying the invention may be used, for example, to provide correct matching between a load and a power amplifier.

What is claimed is:

1. A semiconductor device comprising a base plate, a semiconductor chip mounted on the base plate, a signal pin mounted on the base plate, there being parasitic capacitance between the signal pin and the base plate, a first bond wire connecting the signal pin to the chip, and at least one second bond wire connecting the signal pin to the base plate.

2. A device as claimed in claim 1 wherein the inductance of the second bond wire forms, with the parasitic capacitance, at least part of a parallel resonant circuit, wherein signals on the signal pin at a frequency substantially equal to the resonant frequency of the resonant circuit are substantially unattenuated by the parasitic capacitance.

3. A device as claimed in claim 2 wherein the inductance of the second bond wire forms, with the parasitic capacitance, the parallel resonant circuit.

4. A device as claimed in claim 3 including at least one further signal pin, the further signal pin being mounted on the base plate, there being a parasitic capacitance between the further signal pin and the base plate, and for the further signal pin: (i) a first bond wire connecting the further signal pin to the chip, and (ii) at least one second bond wire connecting the further signal pin to the base plate, the inductance of the second bond wire forming, with the parasitic capacitance associated with the further signal pin, a parallel resonant circuit, wherein signals on the further signal pin at a frequency substantially equal to the resonant frequency of the resonant circuit are substantially unattenuated by the associated parasitic capacitance.

5. A device as claimed in claim 1 wherein the inductances of the signal pin, the first bond wire, and the second bond wire are such that, at the frequency of signals on the signal pin, an impedance transformation is provided between the input to the signal pin and the end of the first bond wire where it connects to the chip.

6. A device as claimed in claim 1, including a first capacitor connected in shunt with the signal pin, and a second capacitor connected in shunt with the end of the first bond wire where it connects to the chip, the values of the first and second capacitors and the inductance of the second bond wire being such as to provide impedance matching at the signal pin and at the end of the first bond wire where it connects to the chip.

7. A device as claimed in claim 3, including a capacitor connected in shunt with the signal pin so as to provide impedance transformation from a high impedance at the signal pin to a low impedance at the end of the first bond wire where it connects to the chip.

8. A device as claimed in claim 3, including a capacitor connected in shunt with the end of the first bond wire where it connects to the chip so as to provide impedance transformation from a low impedance at the signal pin to a high impedance at the end of the first bond wire where it connects to the chip.

9. A device as claimed in claim 1 including a housing enclosing the chip with the base plate.

10. A device as claimed in claim 2 including a housing enclosing the chip with the base plate.

11. A device as claimed in claim 3 including a housing enclosing the chip with the base plate.

12. A device as claimed in claim 4 including a housing enclosing the chip with the base plate.

13. A device as claimed in claim 5 including a housing enclosing the chip with the base plate.

14. A device as claimed in claim 6 including a housing enclosing the chip with the base plate.

15. A device as claimed in claim 7 including a housing enclosing the chip with the base plate.

16. A device as claimed in claim 8 including a housing enclosing the chip with the base plate.

* * * * *